US009691795B2

United States Patent
Jo et al.

(10) Patent No.: US 9,691,795 B2
(45) Date of Patent: Jun. 27, 2017

(54) DISPLAY APPARATUS AND MANUFACTURING METHOD THEREOF

(71) Applicant: Samsung Display Co., Ltd., Yongin-si, Gyeonggi-do (KR)

(72) Inventors: Jung Yun Jo, Namyangju-si (KR); Su Bin Bae, Gyeongsan-si (KR); Sang Hyeon Song, Seoul (KR); Cheol Geun An, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/175,839

(22) Filed: Jun. 7, 2016

(65) Prior Publication Data

US 2016/0379997 A1  Dec. 29, 2016

(30) Foreign Application Priority Data

Jun. 26, 2015 (KR) .................. 10-2015-0091261

(51) Int. Cl.
*H01L 27/14* (2006.01)
*H01L 29/04* (2006.01)
(Continued)

(52) U.S. Cl.
CPC .......... *H01L 27/124* (2013.01); *G06F 3/0416* (2013.01); *H01L 27/1262* (2013.01); *G06F 2203/04103* (2013.01)

(58) Field of Classification Search
USPC ............ 257/252–254, 257–258, 13, 79–103, 257/E51.018–E51.022, E33.001–E33.077, 257/E33.054, E25.028, E25.032, 57, 59, 257/72, 290, 351, 368, 392, 66; 438/22, 438/24, 48
See application file for complete search history.

(56) References Cited

U.S. PATENT DOCUMENTS

2005/0248012 A1* 11/2005 Furihata ............... G02F 1/1345
257/678
2006/0076638 A1* 4/2006 Imaseki ............ G02F 1/13452
257/433
(Continued)

FOREIGN PATENT DOCUMENTS

KR  10-2005-0001263 A  1/2005
KR  10-2005-0003515 A  1/2005
(Continued)

*Primary Examiner* — Tram H Nguyen
(74) *Attorney, Agent, or Firm* — Lewis Roca Rothgerber Christie LLP (57) ABSTRACT

An exemplary embodiment of the described technology relates generally to a display apparatus including a plurality of pixels and corresponding to one area of a substrate for displaying an image, and a pad area corresponding to another area of the substrate, the pad area including a lower electrode configured to transmit an electric signal to the pixels, and a plurality of pad electrodes electrically connecting the lower electrode and a driving chip, wherein each of the pad electrodes includes a first contact surface for contacting the lower electrode, a second contact surface for contacting the driving chip, and an oxide layer on a surface of the pad electrode that is exposed to the outside, and that connects the first contact surface and the second contact surface.

8 Claims, 9 Drawing Sheets

(51) Int. Cl.
    *H01L 29/15*     (2006.01)
    *H01L 27/12*     (2006.01)
    *G06F 3/041*     (2006.01)

(56) References Cited

U.S. PATENT DOCUMENTS

2014/0353619 A1* 12/2014 Park .................... H01L 27/3276
    257/40
2017/0031199 A1* 2/2017 Kimura ............... G02F 1/13452

FOREIGN PATENT DOCUMENTS

| KR | 10-2012-0002426 A | 1/2012 |
| KR | 10-2013-0033368 A | 4/2013 |

\* cited by examiner

DISPLAY APPARATUS AND MANUFACTURING METHOD THEREOF

CROSS-REFERENCE TO RELATED APPLICATION

This application claims priority to, and the benefit of, Korean Patent Application No. 10-2015-0091261 filed in the Korean Intellectual Property Office on Jun. 26, 2015, the entire contents of which are incorporated herein by reference.

BACKGROUND

1. Field

The described technology relates generally to a display apparatus, and a method for manufacturing the same.

2. Description of the Related Art

Various display apparatuses, such as a liquid crystal display (LCD), a plasma display panel (PDP), an organic light emitting diode (OLED) display, an electric field display (FED, an electrophoretic display, and the like, have been developed and researched, thereby influencing modern society. Such display apparatuses include a display panel for displaying an image on a screen to the outside by emitting light of a plurality of colors, and also include a window on the display panel to protect the display panel. Recently, display technology has rapidly developed to the point where the display device further includes a touch panel through which a user can input an input signal through a touch method using a part of the body or using additional input means.

To emit light using the display panel, a driving chip for driving the display panel by receiving an external touch signal may be installed in the outside of the display panel.

A pad electrode may be formed in one side of the display panel for an electric connection between the display panel and the driving chip. The pad electrode is made of a conductive material for the electric connection between the display panel and the driving chip.

In this case, an upper surface of the pad electrode for contacting the driving chip is exposed to the outside, and thus reacts with oxygen in the air, thereby forming an oxide. Because the oxide of the pad electrode is a low insulating material, the oxide increases resistance and interrupts electrical contact with the driving chip. In addition, to mount the driving chip on the pad electrode, the oxide formed on the pad electrode may be crushed by applying strong pressure thereto, in which case the display panel with the pad electrode may be damaged due to the pressure.

The above information disclosed in this Background section is only to enhance the understanding of the background of the described technology, and therefore it may contain information that does not form the prior art that is already known in this country to a person of ordinary skill in the art.

SUMMARY

The described technology provides a display apparatus that can reduce or prevent an oxide layer from being formed on a surface of a pan electrode that contacts a driving chip.

Further, an aspect of the described technology is not limited to the aforementioned aspects, and other unmentioned aspects will be understood by those skilled in the art from the description below A display apparatus according to an exemplary embodiment includes a display area including a plurality of pixels and corresponding to one area of a substrate for displaying an image, and a pad area corresponding to another area of the substrate, the pad area including a lower electrode configured to transmit an electric signal to the pixels, and a plurality of pad electrodes electrically connecting the lower electrode and a driving chip, wherein each of the pad electrodes includes a first contact surface for contacting the lower electrode, a second contact surface for contacting the driving chip, and an oxide layer on a surface of the pad electrode that is exposed to the outside, and that connects the first contact surface and the second contact surface.

Each of the pad electrodes may further include a first metal layer including the first contact surface, a second metal layer on the first metal layer, and a third metal layer on the second metal layer and including the second contact surface, and the oxide layer may includes a first oxide layer of the first metal layer on a surface of the first metal layer exposed to the outside of the pad electrode, a second oxide layer of the second metal layer on a surface of the second metal layer exposed to the outside of the pad electrode, and a third oxide layer of the third metal layer on a surface of the third metal layer exposed to the outside of the pad electrode.

Each of the pixels may include a transistor including a source electrode, a drain electrode, and a gate electrode, and wherein the source electrode, the drain electrode, and the pad electrode include a same material.

According to another exemplary embodiment, a manufacturing method of a display apparatus, which includes a display area including a plurality of pixels for displaying an image, and a pad area including a driving chip electrically connected to the pixels for exchanging an electric signal, includes preparing a substrate including a plurality of lower electrodes electrically connected to the pixels for transmitting an electric signal to the pixels, forming a pad electrode on the substrate that is electrically connected to the lower electrode, forming a metal layer for oxidization on the pad electrode, patterning the pad electrode and the metal layer, oxidizing the metal layer, oxidizing a surface of the pad electrode exposed to the outside, and eliminating the metal layer by cleansing the pad electrode.

The forming of the pad electrode may include forming a first metal layer contacting the lower electrode, forming a second metal layer on the first metal layer, and forming a third metal layer on the second metal layer for contacting the driving chip.

The oxidizing of the metal layer may include forming a hydrosoluble oxide on the metal layer.

The oxidizing of the surface of the pad electrode, and the oxidizing of the metal layer, may include performing plasma-treatment on a surface of the pad electrode and on a surface of the metal layer in an oxygen atmosphere.

The method may further include installing the driving chip on the pad electrode, and the eliminating of the metal layer may be performed before installing the driving chip on the pad electrode.

According to the described technology, there is provided a display apparatus in which a metal oxide is reduced or prevented from being generated on a surface of a pad electrode where a driving chip is installed, such that the driving chip can be easily installed with less pressure and without interrupting electric conductivity, and a manufacturing method thereof. Further, the described technology provides a display apparatus in which an oxide layer is formed on a surface of the pad electrode that is exposed to the outside so that the pad electrode is resistant to corrosion and has improved strength, along with a manufacturing method thereof.

BRIEF DESCRIPTION OF THE DRAWINGS

FIG. 4 to FIG. 9 sequentially illustrate a process for forming a pad electrode in a manufacturing method of a display apparatus according to another exemplary embodiment.

DETAILED DESCRIPTION

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1:
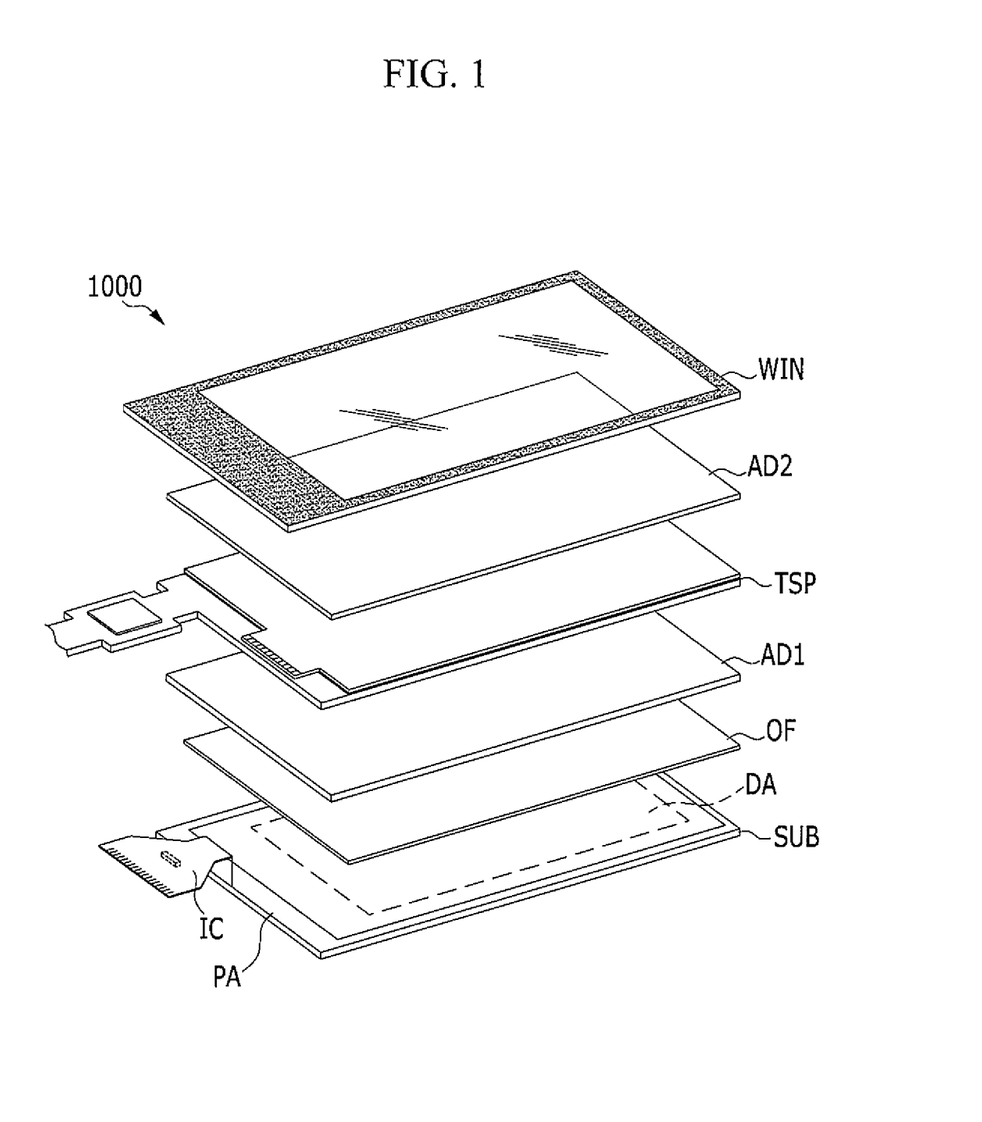
FIG. 1 illustrates an exploded perspective view of a display apparatus according to an exemplary embodiment.
Figure 2:
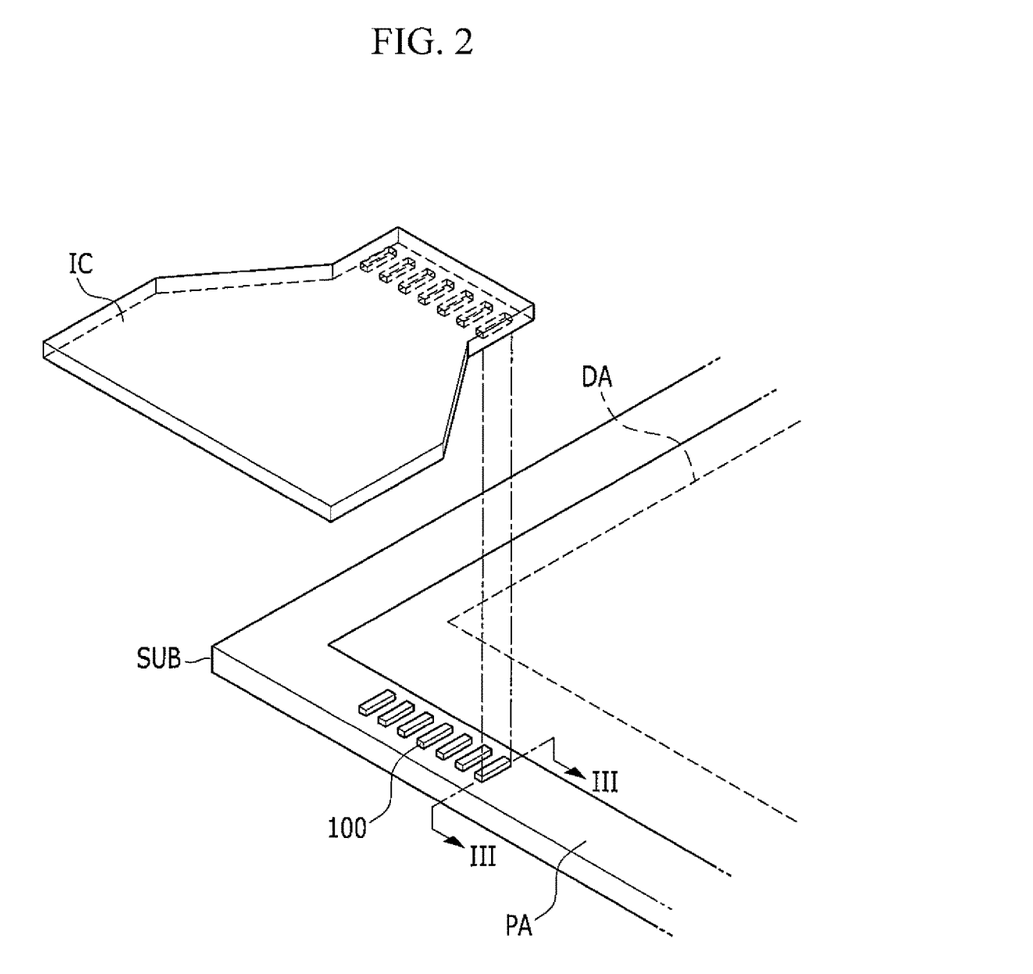
FIG. 2 illustrates an enlarged view of a substrate and a driving chip according to the exemplary embodiment.
Figure 3:
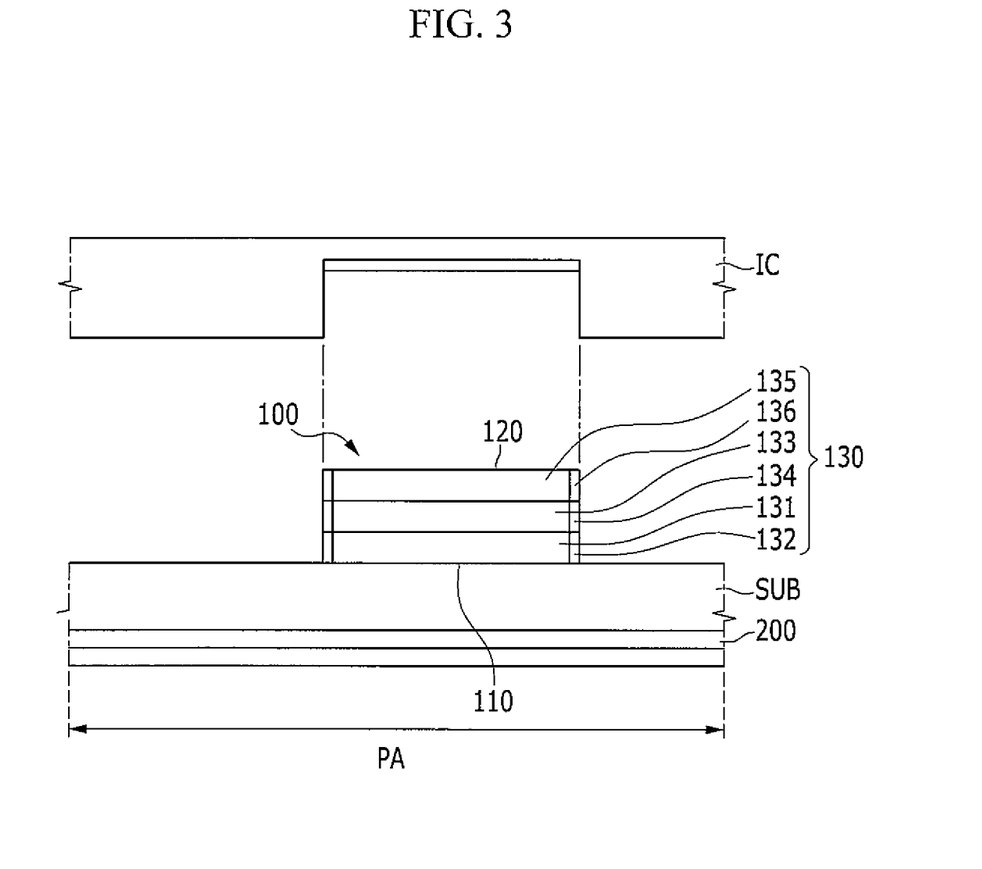
FIG. 3 illustrates a cross-sectional view of the substrate and a pad electrode according to the exemplary embodiment.

FIG. 1 illustrates an exploded perspective view of a display apparatus 1000 according to an exemplary embodiment, FIG. 2 illustrates an enlarged view of a substrate SUB and a driving chip according to the exemplary embodiment, and FIG. 3 illustrates a cross-sectional view of the substrate SUB and a pad electrode 100 according to the exemplary embodiment.

The display apparatus 1000 according to the exemplary embodiment is virtually partitioned into a display area DA corresponding to one area of the substrate SUB, and a pad area PA corresponding to another area of the substrate SUB.

The substrate SUB according to the present exemplary embodiment may be a rigid substrate SUB made of glass or curable plastic, or may be a flexible substrate SUB made of polyimide. As long as the material of the substrate SUB does not make implementation of the described technology not feasible with reference to the description of the described technology below, any material may be included in the scope of the described technology, regardless of the kind and nature of material.

To protect the surface of the substrate SUB, the substrate SUB may further include a buffer layer formed throughout the display area DA and the pad area PA according to the present exemplary embodiment.

Like the substrate SUB, the buffer layer may be made of an electric insulating material, although the buffer layer is not limited thereto.

On the substrate SUB, a touch panel TSP that is configured to receive a signal using a touch method from a user, to convert the signal into an electric signal, and to transmit the electric signal. Also on the substrate SUB is a window WIN at an exterior of the display apparatus 1000 to protect the touch panel TSP.

A touch panel TSP is a signal input panel where a touch sensor is formed on a base member, such as a substrate or a film, to sense external touch pressure, and to convert a signal input through a touch method into an electric signal, and to thereafter transmit the electric signal. That is, the touch panel TSP is an input device that inputs a user's command by recognizing a contact location of the user.

In the present exemplary embodiment, the touch panel TSP is provided in the display apparatus 1000, and is configured to determine an input signal by recognizing a location where a finger or a touch input contact is made. The touch panel TSP may be formed of a panel that is driven as a resistive film type, a capacitive type, an ultrasonic type, or an infrared type, and the resistive film type panel and the capacitive type panel are generally used.

The window WIN is provided at the outermost side of the display apparatus 1000 to protect the display apparatus 1000 from an external environment by providing a barrier for the inside of the display apparatus 1000. Because the window WIN needs a optically transparent characteristic to transmit light generated from the display area DA to the outside, the window WIN may be made of transparent glass or synthetic resin. In addition, to realize a flexible display apparatus, the window WIN may be made of a flexible material, according to the present exemplary embodiment.

Adhesive layers AD1 and AD2 are respectively formed between the substrate SUB and the touch panel TSP, and between the touch panel TSP and the window WIN, to thereby respectively bond the substrate SUB and the touch panel TSP, and bond the touch panel TSP and the window WIN on respective lateral sides of the adhesive layers AD1 and AD2.

The display area DA is an area where an image is able to be displayed, and may be formed at one area of the substrate SUB in the present exemplary embodiment, as shown in FIG. 1 and FIG. 2.

The display area DA according to the present exemplary embodiment may include known constituent elements, such as an electrode for realization of an image, a display layer including a plurality of pixels, a thin film transistor, and the like.

Detailed constituent elements of the display area DA may be changed according to a type of the display apparatus 1000, such as whether the display apparatus 1000 is a liquid crystal display (LCD) 1000, a plasma display panel (PDP) 1000, an organic light emitting diode (OLED) 1000, a field effect display (FED) 1000, or an electrophoretic display 1000, and therefore will not be illustrated in detail.

In addition, in one example, the display apparatus 1000 according to the present exemplary embodiment includes a plurality of signal lines and a plurality of pixels respectively connected thereto. Each of the pixels may be, for example, one of a red pixel, a green pixel, and a blue pixel.

The signal lines include gate lines for transmitting a scan signal, data lines for transmitting a data signal, and driving voltage lines for transmitting a driving voltage.

The gate lines substantially extend nearly parallel to each other in a row direction, and the data lines substantially extend nearly parallel to each other in a column direction. The driving voltage lines may extend in a row direction, a column direction, or may be arranged in a net shape.

Each pixel in the display area DA includes a thin film transistor, which includes a gate electrode, a source electrode, and a drain electrode, and a pixel electrode connected to the drain electrode of the thin film transistor.

Meanwhile, the pad area PA according to the present exemplary embodiment corresponds to another area of the substrate SUB where the display area DA is not formed, and receives an external electric signal for realization of an image, and transmits the signal to the display area DA. Further, the pad area PA may transit an input signal input from the display area DA by a user (e.g., a touch signal) to an external driving chip that controls driving of the display apparatus 1000.

In the pad area PA according to the present exemplary embodiment, a lower electrode 200 and a pad electrode 100 may be formed.

In the present exemplary embodiment, the lower electrode 200 is electrically connected with a thin film transistor formed in a pixel, and is configured to transmit an electric signal to the pixel. In this case, the lower electrode 200 may be electrically connected with the gate electrode of the thin film transistor that is connected with the gate line, and may be formed at the same layer as the gate electrode.

The pad electrode 100 contacts a driving chip IC that is made of a conductive material and that is installed on the outside of the lower electrode 200, thereby electrically connecting the driving chip IC and the lower electrode 200. The pad electrode 100 may be provided in a plurality.

In this case, upper and lower surfaces of the pad electrodes 100 are arranged parallel to each other, and the pad electrode 100 may be formed in a stereoscopic polar shape, or in a stereoscopic frustum-shaped bar including a side surface that connects the top surface and the bottom surface in a height direction. Thus, among surfaces of the pad electrode 100 exposed to the outside, the bottom surface contacting the lower electrode 200 (e.g., through a contact hole in the substrate SUB) may be a first contact surface 110, and the top surface contacting the driving chip IC may be a second contact surface 120, and the side surface of the pad electrode 100 connecting the first contact surface 110 and the second contact surface 120 in the height direction may be formed of an oxide layer.

However, the above-description is limited to the case in which the pad electrode 100 is formed in a stereoscopic polar shape or in a stereoscopic frustum-shaped bar, although any shape that can electrically connect the lower electrode 200 formed in the substrate SUB and the externally installed driving chip IC is also included in the scope of the described technology.

The first contact surface 110 may contact the surface of the lower electrode 200, but this is not restrictive. The first contact surface 110 may contact the lower electrode 200 through a contact hole.

In the present exemplary embodiment, the pad electrode 100 is electrically connected to the source electrode and the drain electrode (hereinafter referred to as source/drain electrodes) of the thin film transistor, which is connected to the data line and the driving voltage line of the display area DA, and the pad electrode 100 may be formed at the same layer as the source/drain electrode.

The pad electrode 100 may have a multi-layered structure including a first metal layer 131, a second metal layer 133, and a third metal layer 135. The first metal layer 131 directly contacts the lower electrode 200 because the first contact surface 110 is at a lower portion of the first metal layer 131. The second metal layer 133 is formed on the first metal layer 131, and the third metal layer 135 is formed on the second metal layer 133, and may directly contact the driving chip IC because the second contact surface 120 is at an upper portion of the second metal layer 133.

In the present exemplary embodiment, the pad electrode 100 may be formed at the same layer as the source/drain electrodes, as previously described, and may be made of the same material as the source/drain electrodes for simplification of a manufacturing process. Thus, the source/drain electrodes may also have a multi-layered structure including a first metal layer 131, a second metal layer 133, and a third metal layer 135, according to the present exemplary embodiment.

The first metal layer 131 may be a metal such as titanium (Ti), the second metal layer 133 may be aluminum (Al), and third metal layer 135 may also be titanium (Ti), like the first metal layer 131. However, such structure is not restrictive, and a conductive material forming the pad electrode 100 may be variously changed in consideration of various factors, such as electrical and mechanical features, economic efficiency, and the like.

An oxide layer may be formed on a surface that is exposed to the outside among the first metal layer 131, the second metal layer 133, and the third metal layer 135. More specifically, an oxide layer (e.g., a first oxide layer) 132 of the first metal layer 131 is formed on the surface of the first metal layer 131, exposed to the outside, an oxide layer (e.g., a second oxide layer) 134 of the second metal layer 133 is formed on the surface of the second metal layer 133, exposed to the outside, and an oxide layer (e.g., a third oxide layer) 136 of the third metal layer 135 is formed on the surface of the third metal layer 135, exposed to the outside.

For example, as previously described, in the first metal layer 131, a titanium oxide layer 132 may be formed on a surface of the first metal layer 131, excluding the first contact surface 110 contacting the lower electrode 200/substrate SUB, and excluding the upper surface where the second metal layer 133 is formed. In the second metal layer 133, an aluminum oxide layer 134 may be formed on a surface of the second metal layer 133, excluding the upper surface and the bottom surface of the second metal layer 133 respectively contacting the first metal layer 131 and the third metal layer 135. In the third metal layer 135, a titanium oxide layer 136 may be formed on a surface of the third metal layer 135, excluding the second contact surface 120 contacting the driving chip IC and the bottom surface contacting the second metal layer 133.

Thus, according to the present exemplary embodiment, the aluminum oxide layer 134, which is not corrodible due to having low reactivity, is formed on the surface of the second metal layer 133, and is formed of corrodible aluminum, such that corrosion of the pad electrode 100 can be reduced or prevented, and such that electrical performance of the product can be improved. Further, because the titanium oxide layers 132 and 136 are respectively formed on the corresponding surface of the first metal layer 131 and the corresponding surface of the third metal layer 135 (excluding the first contact surface 110 contacting the lower electrode 200/substrate SUB, and excluding the second contact surface 120 contacting the driving chip IC), durability of the pad electrode 100 can be improved while reducing or preventing deterioration of electric performance. Further, when the driving chip IC is installed in the pad area PA, damage to the display panel of the display apparatus 1000, which may otherwise occur due to strong pressure being applied to break the oxide layer at the second contact surface 120 on the third metal layer 135, can be reduced or prevented.

The display apparatus 1000 according to the exemplary embodiment has been described. Hereinafter, a method for manufacturing a display apparatus 1000 according to another exemplary embodiment will be described.

FIG. 4 to FIG. 9 illustrate a process for forming a pad electrode 100 in a manufacturing method of a display apparatus 1000 according to another exemplary embodiment. To conveniently illustrate the process for forming the pad electrode 100 like in FIG. 3, FIG. 4 to FIG. 9 show enlarged views of only a substrate SUB and the pad electrode 100.

As shown in FIG. 4 to FIG. 9, the process for forming a pad area PA in the manufacturing method of the display apparatus 1000 according to the present exemplary embodiment includes: preparing the substrate SUB; forming pad electrode layers 131*a*, 133*a*, and 135*a;* forming a metal layer 137 for oxidization; forming the pad electrode 100; oxidizing a surface of the pad electrode 100 and the metal layer 137; and eliminating the metal layer 137.

Figure 4:
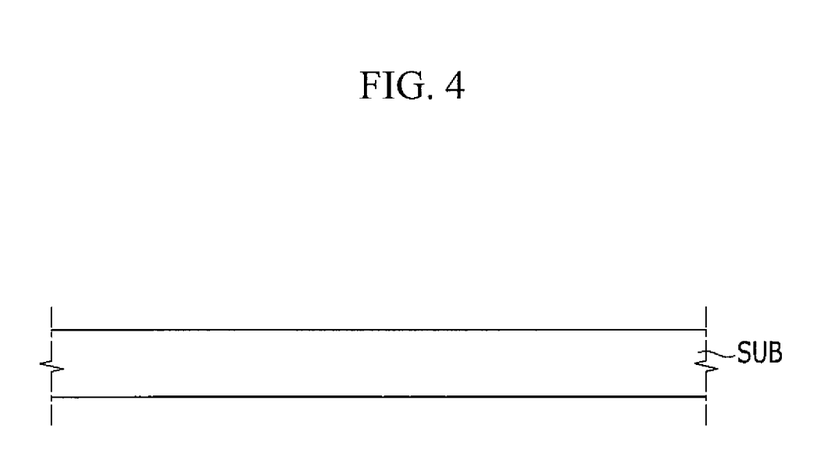

As shown in FIG. 4, the substrate SUB according to the present exemplary embodiment may be prepared. According to the present exemplary embodiment, the substrate SUB may be made of a rigid or flexible material, as previously described, and may further include a buffer layer thereon.

In addition, the substrate SUB includes a display area DA and a pad area PA that are vertically partitioned in the present exemplary embodiment. The display area DA and the pad area PA of the present exemplary embodiment are the same as those of the display apparatus 1000 according to the above-described exemplary embodiment, and therefore no further description will be provided.

As shown in FIG. 3, a lower electrode 200 that electrically connects the pad electrode 100 and pixels of the display area DA may be formed in/at the substrate SUB in the present exemplary embodiment.

Figure 5:
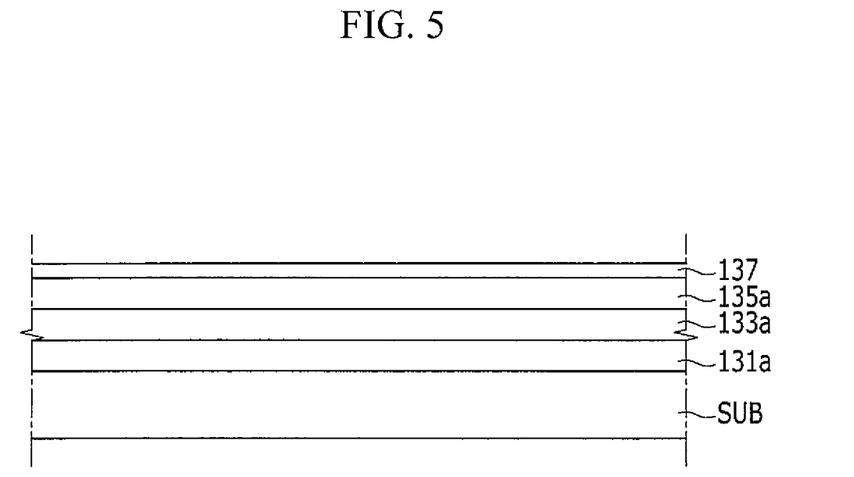

When the substrate SUB is prepared, as shown in FIG. 5, a step for forming the pad electrode layers 131a, 133a, and 135a on the substrate SUB may be performed. According to the present exemplary embodiment, the pad electrodes 100 formed by patterning the pad electrode layers 131a, 133a, and 135a may be made of a conductive material for electrically connecting the lower electrode 200 formed in the substrate SUB and an externally installed driving chip IC.

As previously described, the pad electrode layers 131a, 133a, and 135a according to the present exemplary embodiment may be electrically connected to the source/drain electrodes forming a thin film transistor of a pixel in the display area DA, and for process simplification, the pad electrode layers 131a, 133a, and 135a may be formed on the same layer as the source/drain electrodes, and the pad electrode layers 131a, 133a, and 135a, and the source/drain electrodes may be simultaneously formed.

In this case, the forming of the pad electrode layers 131a, 133a, and 135a according to the present exemplary embodiment may include forming a first metal layer 131a, forming a second metal layer 133a, and forming a third metal layer 135a to form the pad electrode layers 131a, 133a, and 135a with a multi-layered structure. Thus, the source/drain electrodes formed together with the pad electrode layer 131a, 133a, and 135a may also have a multi-layered structure.

The first metal layer 131a contacts the lower electrode 200, the second metal layer 133a is formed on the first metal layer 131a, and the third metal layer 135a is formed on the second metal layer 133a and may contact a driving chip IC. The respective elements are the same as those described in the above-stated exemplary embodiment, and therefore no further description will be provided.

When the pad electrode layers 131a, 133a, and 135a including the first metal layer 131a, the second metal layer 133a, and the third metal layer 135a are formed, a metal layer 137 for oxidization may be further formed on the pad electrode layers 131a, 133a, and 135a. Hereinafter, the metal layer 137 for oxidization will be referred to as an oxidization metal layer 137.

The forming of the oxidization metal layer 137 is a step for forming a metal layer that is not oxidized on the third metal layer 135a. The metal layer may be formed of an oxide formed from oxidization, and the oxide may be a hydrosoluble oxide that can be cleaned by water.

In the present exemplary embodiment, a material for forming the oxidization metal layer 137 that forms the hydrosoluble oxide includes molybdenum (Mo). A molybdenum oxide (MoOx) has various features depending on a value of x, and a chemical formula of the molybdenum oxide according to the present exemplary embodiment may be $MoO_3$, in which the value of x is 3. However, this is not restrictive, and any compound that can be a hydrosoluble compound by being oxidized may be applicable within the scope of the described technology.

Figure 6:
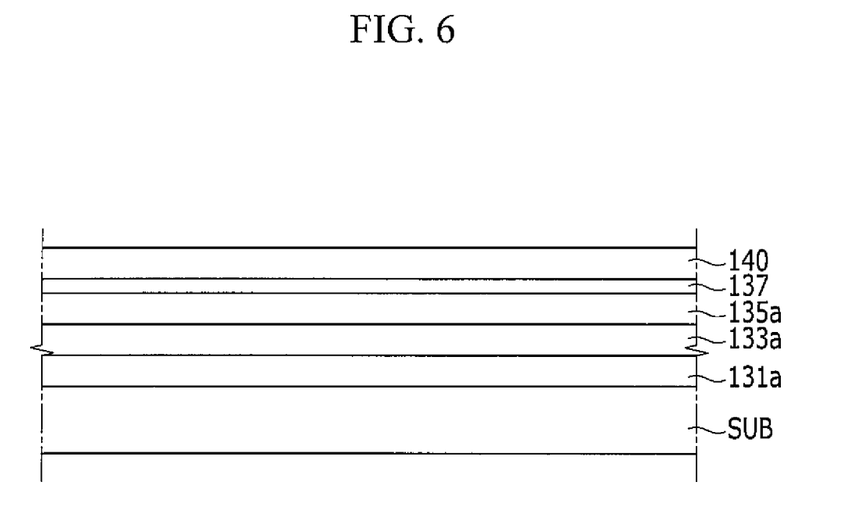

When the oxidization metal layer 137 is formed, the pad electrode layers 131a, 133a, and 135a and the oxidization metal layer 137 are patterned such that the pad electrode 100 is formed. In the present embodiment, metal layers formed in a plane on the substrate SUB are defined as the pad electrode layers 131a, 133a, and 135a, and a configuration after patterning the electrode format is defined as the pad electrode 100.

Figure 7:
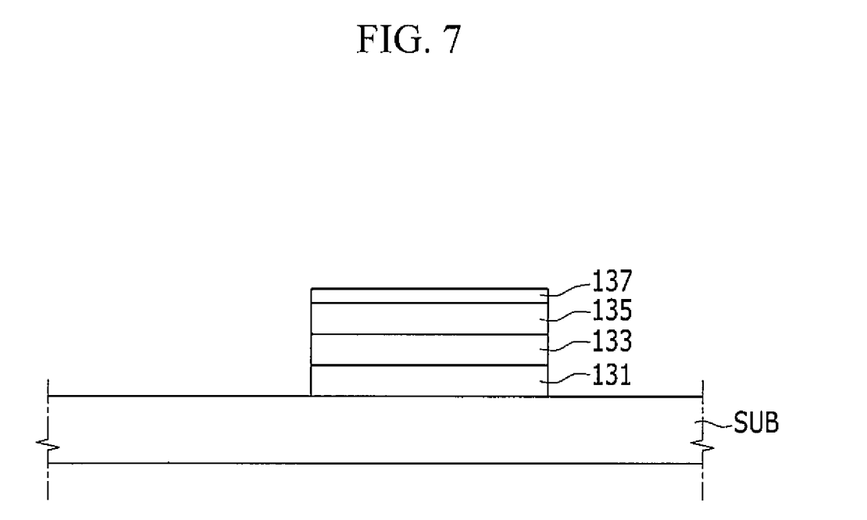

FIG. 6 illustrates that a photoresist layer 140 is formed on the oxidization metal layer 137. As shown in FIG. 6, the photoresist layer 140 is formed by coating a photoresist, and the photoresist is cured by being exposed, thereby etching an unnecessary portion, and then the photoresist layer 140 is eliminated such that the pad electrode 100 shown in FIG. 7 is formed.

It should be noted that the above method for forming the pad electrode 100 is not restrictive, and various methods may be used for forming the pad electrode 100.

Figure 8:
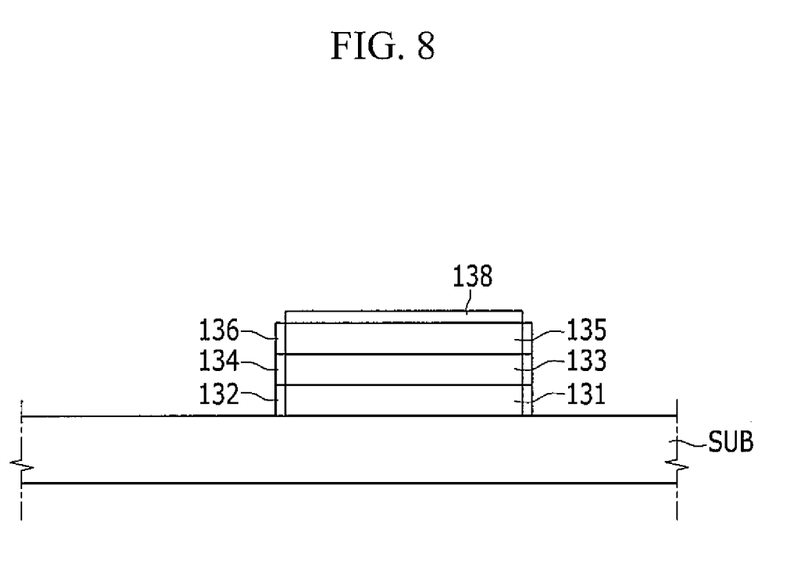

In the present exemplary embodiment, the manufacturing method of the display apparatus includes oxidizing the surface of the pad electrode 100 after forming the pad electrode 100. According to the present exemplary embodiment, the surface of the pad electrode 100 can be oxidized by performing plasma-treatment after preparing/creating an oxygen atmosphere. However, this is not restrictive, and various methods may be used to oxidize the surface of the pad electrode 100.

In this case, only the surfaces of the pad electrode 100 that is exposed to the outside (among the surfaces of the pad electrode 100) is oxidized, as shown in FIG. 8, and thus a metal layer in the pad electrode 100 can be maintained according to the present exemplary embodiment. Thus, conductivity can be maintained through a metal material maintained in the pad electrode 100.

However, the oxidization metal layer 137 formed above the pixel electrode 100 is much thinner than the first metal layer 131, the second metal layer 133, and the third metal layer 135 included in the pad electrode 100, and thus the oxidization metal layer 137 can be wholly oxidized, thereby forming an oxide layer 138 of the oxidization metal layer 137.

In addition, after the oxide layer 138 of the oxidization metal layer 137 is eliminated by cleansing, even if the oxidization metal layer 137 is not completely oxidized, when there is a residual metal material from the oxidization metal layer 137, and if the amount of residual metal material is not sufficient to interrupt the electric conductivity of the pad electrode 100, the scope of the described technology will not be limited.

Figure 9:
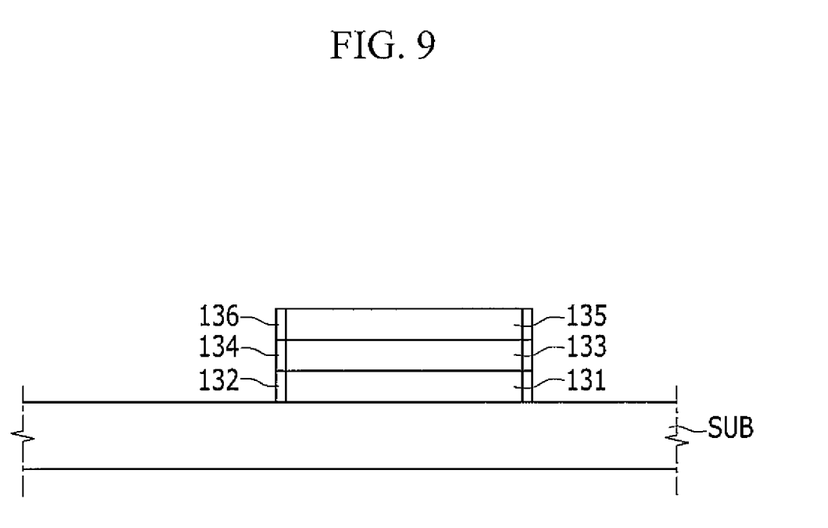

As described, the cleansing is performed after the oxidization of the surface of the pad electrode 100 and the oxidization metal layer 137.

The cleansing is performed to eliminate impurities existing in the substrate SUB before installing the driving ship on the substrate SUB. In the present exemplary embodiment, a solvent such as distilled water is used to perform the cleansing process.

In this case, the oxide layers 132, 134, and 136 formed on the surfaces of the pad electrode 100 are not hydrosoluble oxides, and thus they remain even after the cleansing is performed. However, the oxide 138 formed in the oxidization metal layer 137 is a hydrosoluble material, and thus the oxide 138 may be dissolved by a cleansing solution and then eliminated. Thus, as shown in FIG. 9, none of the oxide 138 of the oxidization metal layer 137 remains on the upper surface of the pad electrode 100, and thus the metal surface (e.g., of the third metal layer 135) may be exposed.

After the cleansing process, a step for drying the residual solvent may further be included, and a step for installing the driving chip IC may be performed before oxidization of the exposed metal surface of the pad electrode 100 (e.g., the top surface of the third metal layer 135). When the driving chip IC is installed on the metal surface of the pad electrode 100 where no oxide is formed, electric conductivity may be improved, and the driving chip IC can be easily installed on the pad electrode 100 without applying a strong pressure.

The display apparatus 1000 according to the exemplary embodiment, and the manufacturing method of the display apparatus according to another exemplary embodiment, have been described. According to the exemplary embodiments, the display apparatus 1000 that can reduce or prevent generation of the metal oxide on the surface of the pad electrode 100 where the driving chip IC is installed, and that can easily allow installation of the driving chip IC with much less pressure and without interrupting electric conductivity, along with the manufacturing method thereof, can be provided. Further, according to the exemplary embodiments, the display apparatus 1000 including a pad electrode 100 in which an oxide layer is formed on a surface exposed to the outside among the surfaces thereof, and thus is resistant to corrosion and has improved strength, along with a manufacturing method thereof, can be provided.

Although the specific exemplary embodiments have been described and illustrated as above, the described technology is not limited to the exemplary embodiments described herein, and it would be apparent to those skilled in the art that various changes and modifications might be made to these embodiments without departing from the spirit and the scope of the invention. Therefore, changed and modified examples should not be individually appreciated separate from the technical spirit or the viewpoint of the described technology, and it should be appreciated that modified exemplary embodiments will be included in the appended claims, and their equivalents, of the described technology.

What is claimed is:

1. A display apparatus comprising:
    a display area comprising a plurality of pixels and corresponding to one area of a substrate for displaying an image; and
    a pad area corresponding to another area of the substrate, the pad area comprising:
        a lower electrode configured to transmit an electric signal to the pixels; and
        a plurality of pad electrodes electrically connecting the lower electrode and a driving chip,
    wherein each of the pad electrodes comprises:
        a first contact surface for contacting the lower electrode;
        a second contact surface for contacting the driving chip; and
        an oxide layer on a surface of the pad electrode that is exposed to the outside, and that connects the first contact surface and the second contact surface.

2. The display apparatus of claim 1, wherein each of the pad electrodes further comprises:
    a first metal layer comprising the first contact surface;
    a second metal layer on the first metal layer; and
    a third metal layer on the second metal layer and comprising the second contact surface, and
    wherein the oxide layer comprises:
        a first oxide layer of the first metal layer on a surface of the first metal layer exposed to the outside of the pad electrode;
        a second oxide layer of the second metal layer on a surface of the second metal layer exposed to the outside of the pad electrode; and
        a third oxide layer of the third metal layer on a surface of the third metal layer exposed to the outside of the pad electrode.

3. The display apparatus of claim 1, wherein each of the pixels comprises a transistor comprising a source electrode, a drain electrode, and a gate electrode, and
    wherein the source electrode, the drain electrode, and the pad electrode comprise a same material.

4. A manufacturing method of a display apparatus comprising a display area comprising a plurality of pixels for displaying an image, and a pad area comprising a driving chip electrically connected to the pixels for exchanging an electric signal, the method comprising:
    preparing a substrate comprising a lower electrode electrically connected to the pixels for transmitting an electric signal to the pixels;
    forming a pad electrode on the substrate that is electrically connected to the lower electrode;
    forming a metal layer for oxidization on the pad electrode;
    patterning the pad electrode and the metal layer;
    oxidizing the metal layer;
    oxidizing a surface of the pad electrode exposed to the outside; and
    eliminating the metal layer by cleansing the pad electrode.

5. The manufacturing method of the display apparatus of claim 4, wherein the forming of the pad electrode comprises:
    forming a first metal layer contacting the lower electrode;
    forming a second metal layer on the first metal layer; and
    forming a third metal layer on the second metal layer for contacting the driving chip.

6. The manufacturing method of the display apparatus of claim 4, wherein the oxidizing of the metal layer comprises forming a hydrosoluble oxide on the metal layer.

7. The manufacturing method of the display apparatus of claim 4, wherein the oxidizing of the surface of the pad electrode, and the oxidizing of the metal layer, comprises performing plasma-treatment on a surface of the pad electrode and on a surface of the metal layer in an oxygen atmosphere.

8. The manufacturing method of claim 4, further comprising installing the driving chip on the pad electrode,
    wherein the eliminating of the metal layer is performed before installing the driving chip on the pad electrode.

* * * * *